United States Patent [19]

Olla et al.

[11] Patent Number: 4,778,146

[45] Date of Patent: Oct. 18, 1988

[54] LEADFRAME FOR FLASH-FREE INSERT MOLDING AND METHOD THEREFOR

[75] Inventors: Mike Olla, Flowermound; Harold Trammell, Colleyville; Linn Garrison, Garland, all of Tex.

[73] Assignee: ASM Fico, Netherlands

[21] Appl. No.: 28,493

[22] Filed: Mar. 20, 1987

[51] Int. Cl.$^4$ .............................................. B28B 79/00
[52] U.S. Cl. ........................................ 249/85; 249/93; 264/272.15; 264/272.17; 437/212
[58] Field of Search ................... 264/272.11, 272.15, 264/272.17; 249/85, 93; 437/212, 211

[56] References Cited

U.S. PATENT DOCUMENTS

| | | | |
|---|---|---|---|
| 4,109,373 | 8/1978 | Fennessy et al. | 264/272.17 |
| 4,490,902 | 1/1985 | Eytcheson et al. | 264/272.17 |
| 4,615,857 | 10/1986 | Baird | 264/272.17 |

FOREIGN PATENT DOCUMENTS 61-144033  7/1986  Japan .............................. 264/272.17

Primary Examiner—Richard V. Fisher
Assistant Examiner—Wanda L. Millard
Attorney, Agent, or Firm—Harry M. Weiss & Associates

[57] ABSTRACT

Improved leadframe and method for the insert molding of semiconductor components or the like. A plurality of leads separated by zero-flash tab means for controlling the flash during molding are formed in a single sheet of material. The zero-flash tab means are stamped from the stock sheet and then reinserted into the area between adjacent leads. The zero-flash tab means desirably comprise a ridge section for strength and facilitating removal after the molding operation.

6 Claims, 1 Drawing Sheet

LEADFRAME FOR FLASH-FREE INSERT MOLDING AND METHOD THEREFOR

BACKGROUND OF THE INVENTION

1. Field of the Invention

This invention relates generally to the plastic molding of objects having a plurality of protruding metallic inserts, and more specifically, to a leadframe suitable for the plastic encapsulation of semiconductor devices.

2. Description of the Prior Art

During the process of encapsulating in plastic, a semiconductor device (or integrated circuit) is assembled on a metallic leadframe which facilitates the making of external electrical connections. The device and the leadframe are then inserted into a mold cavity while the leads extend outside of the cavity. The mold is heated and the plastic is injected into the mold in liquid or semi-liquid form under very high pressure. Due to its fluidity, the plastic material runs out of the mold through any crevices where the sealing is imperfect. In the past, to avoid leakage between the leads and the consequent flash, the mold has been castellated. This, however, increases the costs of the mold and leads to further sealing problems where the thickness of the leadframe stock is variable. Another technique used to reduce the flash caused by leakage between the metallic leads is to employ dam-bars which are incorporated into the leadframe. Dam-bars comprise a portion of the leadframe extending between leads so that mold closure may be effected without castellations. Subsequent to the molding operation, the dam-bars are punched out. This punching out process dictates that the dam-bars must be sufficiently far from the package to allow their removal without damaging the package. Since the mold compound is present at the dam-bar and the space between the leads is small, the punches used to remove the dam-bars are fragile and have a limited liftetime. Two other problems inherent to the punching out process are that the leads can be damaged by the punches and that mold compound is left on the leads which may foul or damage any further equipment which handles the device. Technologic progress has led to ever increasing lead counts and smaller packages which in turn has led to decreasing space between the leads. Therefore, smaller and more fragile dam-bar punches are required and the possibility of lead damage and unremoved flash is increased.

Thus a need exists for an encapsulation process, including an improved leadframe, which will reduce or eliminate the flash that results from the molding operation, and, which will mitigate the requirements of the trim and form operation subsequent to the molding process.

SUMMARY OF THE INVENTION

It is an object of this invention to provide an improved leadframe for the insert molding of small objects.

It is another object of this invention to provide an improved leadframe for the insert molding of semiconductor electronic devices and integrated circuits.

It is a further object of this invention to provide a leadframe which susbstantially prevents flash between the leads of a plastic-encapsulated electronic package.

It is yet another object of this invention to provide a leadframe incorporated portions for the preclusion of interlead flash, which portions may be easily punched out upon the completion of the molding operation.

It is a further object of this invention to prevent flash between leads right up to the body of semiconductor electronics package.

It is a still further object of this invention to provide an improved leadframe which is utilized in an improved encapsulation process.

In accordance with a preferred embodiment of this invention, a leadframe portion, which is not attached to the leads in the vicinity of the edge of the package body, replaces the conventional leadframe dam-bars. This detached portion of the leadframe is called a zero-flash tab.

In accordance with another embodiment of this invention, the zero-flash tab extends right up to the edge of the package body.

The foregoing and other objects, features and advantages of this invention will be apparent from the following, more particular, description of the preferred embodiments of this invention, as illustrated in the accompanying drawings.

DETAILED DESCRIPTION

Figure 3:
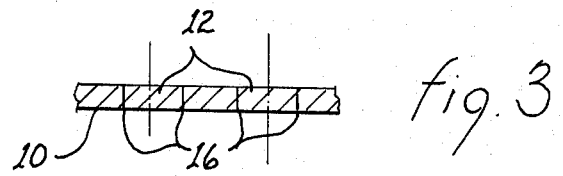
Figure 1:
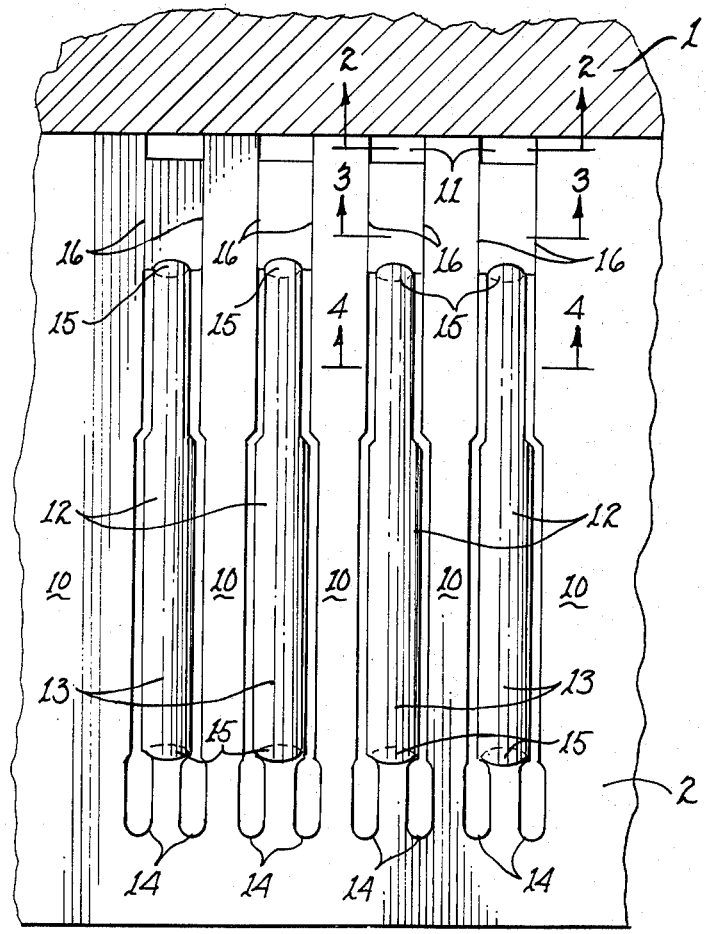
FIG. 1 is a top view of a portion of a leadframe incorporation zero-flash tabs according to the present invention.

Referring now to FIG. 1, the invention is illustrated by a top view of a portion of an improved electronics package comprising a plastic body portion 1 and a plurality of leads 10 extending at generally right angles from the plastic body portion 1. Both the leads 10 and the tabs 12 are integral with and extend inwardly from the outer extremity of metallic leadframe 2. The leads 10 extend into the region of the plastic body 1 in order to support or connect to an integrated circuit housed in the plastic body. As shown in FIG. 3, which is a cross-section of the leadframe where mold closure is effected near the plastic body 1, the leads 10 and the zero-flash tabs 12 form a substantially continuous member having a uniform cross-section. The mold can be positively closed at this point without the necessity for castellations to fit between adjacent leads. Leads 10 and zero-flash tabs 12 are separated by part lines 16 which are the result of stamping the tabs 12 from the sheet stock and then reinserting them into the leadframe.

Figure 4:
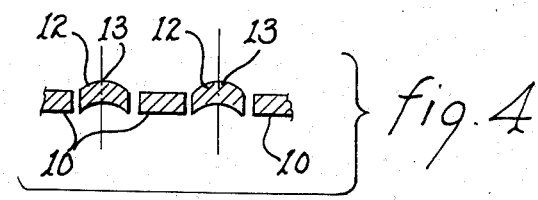

Referring now to FIG. 4, there is illustrated in cross-section a portion of the leadframe exterior to the situs of leadframe closure. From this figure and from FIG. 1, it may be seen that the zero-flash tabs 12 hvae a ridge section 13 which serves two desirable purposes. First, the ridge or bow 13 in the zero-flash tabs 12 pulls each tab away from the adjacent leads to reduce lead splay and reinsertion forces during stamping. Second, the ridge section 13 stiffens each zero-flash tab 12 to aid its removal during the trim and form process and to prevent mold compound blowout during the molding operation. Referring again to FIG. 1, a series of corner relief holes 14 are shown, which relief holes allow the leadframe strip to be formed without inducing excessive stress which would distort the leadframe.

Figure 2:
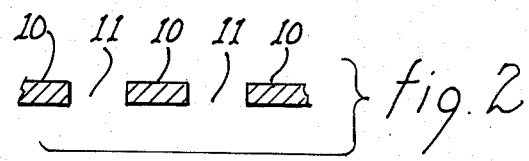
FIGS. 2-4 are cross-sections through the indicated portions of FIG. 1 to show the construction details of a leadframe including a zero-flash tab.

FIG. 2 is a cross-section of the leadframe interior near the termination of the zero-flash tabs 12 at the extremity of the reinsertion area. As further shown in FIG. 1, a small space 11 may be left between the end of each zero-flash tab 12 and the plastic body 1 of the electronics package in order to facilitate the trimming of the zero-flash tabs from the rest of the leadframe. Alternatively, the zero-flash tabs 12 may extend right up the plastic body 1 thus eliminating the spaces 11.

While the invention has been particularly shown and described with respect to preferred embodiments thereof, it will be apparent to those skilled in the art that changes in form and detail may be made without departing from the spirit and scope of the invention.

We claim:

1. A leadframe for substantially flash-free insert molding, comprising a plurality of metallic leads separated by zero-flash tab means adjoining each of said plurality of metallic leads for minimizing the escape of molding compound during the molding operation, each of said zero-flash tab means comprising ridge means for strengthening said tab means, and said plurality of said metallic leads and said zero-flash tab means having been stamped from a common piece of material and said zero-flash tab means having been reinserted between said plurality of leads so that said leads and said zero-flash tabs form a substantially continuous member having a substantially uniform cross-section.

2. The leadframe according to claim 1, wherein said zero-flash tab means are common with said plurality of metallic leads at their outer extremities.

3. The leadframe according to claim 2, further including means defining stress relief holes for said zero-flash tab means at their outer extremities.

4. A metallic leadframe for substantially flash-free insert molding, comprising in combination:
   an outer extremity support portion;
   a plurality of leads extending inwardly from said outer extremity support portion;
   a plurality of zero-flash tab means for containing the mold compound during the molding operation, each of said tab means extending inwardly of said outer extremity support portion and lying between said leads, and each of said tab means having been stamped from said metallic leadframe and reinserted between said leads to form a substantially continuous member having a substantially uniform cross-section; and
   said zero-flash tab means comprising ridge means for strengthening said tab means.

5. A method for substantially flash-free insert molding of semiconductor devices comprising the steps of:
   providing a leadframe having a plurality of metallic leads;
   providing zero-flash tab means adjoining and separating each of said plurality of metallic leads for minimizing the escape of molding compound during the molding operation;
   stamping said metallic leads and said zero-flash tab means from a common piece of material;
   providing ridge means for strengthening said zero-flash tab means; and
   reinserting said zero-flash tab means between said metallic leads to form a substantially continuous member having a substantially uniform cross-section.

6. A method for providing a metallic leadframe for substantially flash-free insert molding, comprising the steps of:
   providing an outer extremity support portion;
   providing a plurality of leads extending inwardly from said outer extremity support portion;
   providing a plurality of zero-flash tab means for containing the mold compound during the molding operation, each of said tab means extending inwardly of said outer extremity support portion and lying between said leads;
   forming ridge means in said zero-flash tab means for strengthening said tab means; and
   stamping said zero-flash tab means from said metallic leadframe and reinserting said tab means into said leadframe to form a substantially continuous member having a substantially continuous cross-section.

* * * * *